United States Patent [19]
Eichinger et al.

[11] 3,949,210
[45] Apr. 6, 1976

[54] SEMICONDUCTOR GAMMA RADIATION DETECTOR

[76] Inventors: Peter Eichinger, No. 38 Ungererstrasse, 8 Munich 40; Hartmut Kallmann, No. 13, Elektrastrasse, 8 Munich 81, both of Germany

[22] Filed: Dec. 10, 1974

[21] Appl. No.: 531,402

[30] Foreign Application Priority Data
Dec. 11, 1973  Germany............................ 2361635

[52] U.S. Cl.................................. 250/370; 250/336
[51] Int. Cl.².............................................. G01T 1/22
[58] Field of Search..................................... 250/370

[56] References Cited
UNITED STATES PATENTS

| | | |
|---|---|---|
| 2,706,792 | 4/1955 | Jacobs ................................ 250/370 |
| 2,745,973 | 5/1956 | Rappaport ........................... 250/370 |
| 3,493,752 | 2/1970 | Jund et al. ........................... 250/370 |

*Primary Examiner*—Harold A. Dixon
*Attorney, Agent, or Firm*—John C. Smith, Jr.

[57] ABSTRACT

A gamma radiation detector comprises a semiconductor body and two metal electrodes attached to two spaced surface zones of said semiconductor body, said detector being characterized by the combination of the following features: (*a*) The semiconductor body consists of a uniform semiconductor material of the same conductivity type; (*b*) Charge carriers of both types are mobile in the semiconductor material and the product of their mobility multiplied by their free drift time (life) exceeds $10^{-9}$ $m^2V^{-1}$ for each type of carrier; (*c*) An insulating layer which is thin in relation to the distance separating said two surface zones is interposed between at least one of said electrodes and the surface zone to which it is attached.

9 Claims, 3 Drawing Figures

SEMICONDUCTOR GAMMA RADIATION DETECTOR

BACKGROUND OF THE INVENTION

The classical apparatus for gamma ray spectroscopy, namely the combination of a crystal scintillation counter with a photomultiplier, has the advantage of having a large detection volume, but the energy resolution still leaves something to be desired. On the other hand, recently developed detectors based on the use of semiconductors in which the gamma quanta are detected in the depopulation zone of a reverse-biased p-n or p-i-n junction or metal-semiconductor contact, have the advantage of providing good energy resolution, although at least in the case of the germanium detector which has so far been nearly exclusively used, the small number of protons in the germanium nucleus ($Z = 32$) in conjunction with the limited volume are responsible for a detection efficiency which is much inferior to that of a scintillation counter. Moreover, germanium detectors must be cooled to the temperature of liquid nitrogen and the cooling and vacuum system required is a serious obstacle in the way of many applications.

The drawback of the low detection efficiency of semiconductor detectors can be overcome by using semiconductor materials having higher atomic numbers, and compound semiconductors of the type $A_{II}B_{VI}$ primarily suggest themselves. Moreover, the generation of thermal carriers of some of these semiconductor materials is so low that operation at room temperature or with only slight cooling is possible (e.g. CdTe, CdS). Although crystals of such semiconductor materials of satisfactory purity have recently been successfully produced, it has nevertheless so far been impossible to overcome the contacting problems which arise and to produce practicable gamma detectors of this type although the principle has been known for a long time (cf. for instance Brit. Pat. Specn No. 995,886). In order to avoid the generation of major dark currents non-injecting contacts must be provided and the high field strengths required for carrier collection, particularly in the case of a less pure semiconductor material, make high demands upon the electrical breakdown resistance of the contacts. The present state of the art does not yet permit pn-junctions which satisfy these several requirements to be produced from these semiconductor materials and the employment of metal-semiconductor contacts is problematic because of local variations in doping and the occurrence of local dielectric breakdown. Consequently the operating voltages and hence energy resolution in gamma detectors using semiconductor materials of high atomic number are in practice governed by the nature of the contacts.

SUMMARY OF THE INVENTION

It is therefore the object of the present invention to provide a semiconductor gamma detector which has stable operating properties at high operating voltages and which therefore permits the employment of semiconductor materials having high atomic numbers and high detection efficiency for gamma spectroscopy.

To attain this object the present invention provides a semiconductor gamma radiation detector which comprises a semiconductor body and two metal electrodes attached to two spaced surface zones of said semiconductor body and possesses the following features in combination:

a. The semiconductor body consists of a uniform semiconductor material of the same conductivity type (i.e. containing no barriers);

b. Charge carriers of both types are mobile in the semiconductor material and the product of their mobility times their mean free drift time (life) exceeds $10^{-9}$ $m^2$ $V^{-1}$ for each type of carrier;

c. An insulating layer which is thin in relation to the distance separating the two surface zones is interposed between at least one of the electrodes and the surface zone to which it is attached.

Preferably the surface zones will be substantially parallel on opposite sides of a monocrystal semiconductor body which should be at least 0.5 mm thick between the two surface zones.

Other embodiments and useful developments of the invention are defined in the claims.

The feature defined in (b) ensures that 80% of the charge carriers created by the gamma radiation that is to be detected and drifting across an interelectrode distance of 0.5 mm under the driving force of an electrical field of $10^6$ $V.m^{-1}$ will still contribute to the generation of the electrical output signal. The transit time will then be half the mean life of the carrier.

With reference to the feature defined in (c) it should be observed that in a publication relating to the effect of the contact on current pulses induced by alpha particles in cadmium sulphide crystals (*Zeitschr.Phys.* 172, 19–48 (1963), particularly FIG. 7 and the relevant text on page 28) the behaviour of a cadmium sulphide crystal between metal electrodes each insulated from the crystal by a thin mica plate has already been described. The cadmium sulphide crystal was only about 75 $\mu$m thick, the life of the holes was very short (the product of the mobility times the life of the holes was about $10^{-12}$ $m^2.V^{-1}$, cf. page 37 ibid.), and the amplitude of the current pulses caused by the alpha particles was only a fraction of the amplitude obtained with metal contacts. The calculated useful operating time was only a few seconds. This arrangement was therefore rejected as useless, and it was not further examined. Moreover, this publication contains no indication that the provision of an insulating layer between a metal electrode and a semiconductor body in combination with other essential features might possibly lead to the development of a useful gamma detector having very superior properties.

BRIEF DESCRIPTION OF THE DRAWING

Some preferred embodiments of the invention will now be described by way of example and with reference to the accompanying drawing, in which.

DESCRIPTION OF THE PREFERRED EMBODIMENTS

Figure 1:
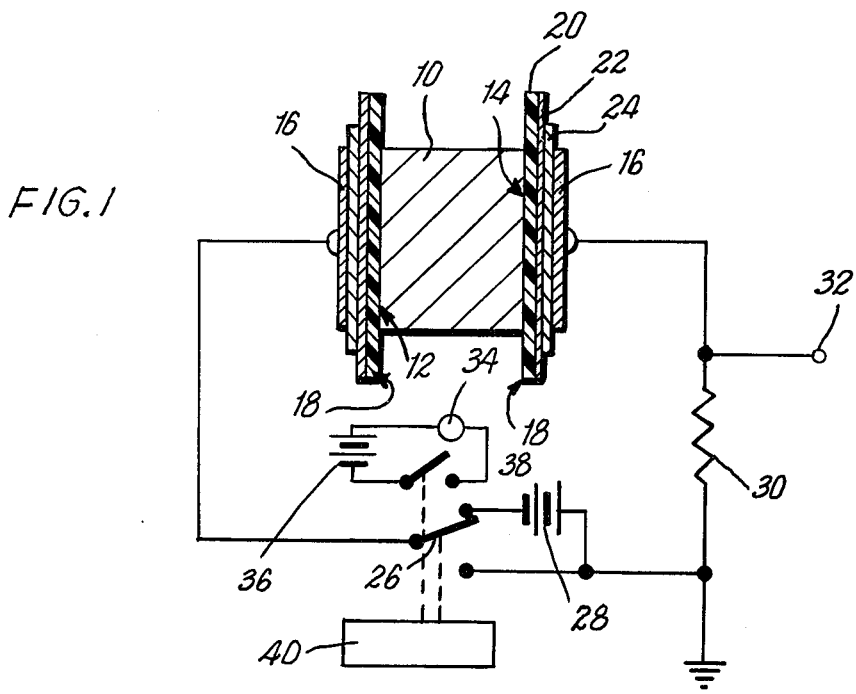
FIG. 1 is a schematic representation of an embodiment of the invention.

FIG. 1 shows a gamma ray detector which comprises a mono-crystalline body 10 consisting of semiconductor material and preferably containing at least one element of relatively high atomic number (preferably Z over 50) to ensure a high detection sensitivity for gamma rays. Particularly suitable semiconductor materials are compounds of the type $A_{II}B_{VI}$, i.e. cadmium sulphide, cadmium selenide, cadmium sulphide selenide, as well as lead sulphide, cadmium telluride and so forth.

The semiconductor material for such a semiconductor body should be very pure to give charge carriers of both types, i.e. to electrons and holes, a sufficiently long life and adequate mobility to enable them to drift a maximum possible distance after having been created by a gamma quantum. This will be later referred to in greater detail.

The surfaces of the semiconductor body 10, particularly of the two sides which connect the two opposite substantially parallel faces 12 and 14, are etched or otherwise treated to minimize the number of surface defects, trapping centers and so forth.

Affixed to each of the faces 12 and 14 is an electrode arrangement which substantially consists of a metal electrode 16 and an insulating layer 18 electrically separating the electrode 16 from the respective face. Compared with the thickness of the semiconductor body 10 betwween its faces 12 and 14 the insulating layer 18 is very thin and will preferably consist of a plastics foil, such as a metallized polyester foil, for instance of the kind marketed under the trade name "Mylar".

In the embodiment shown in FIG. 1 each electrode arrangement may comprise a piece of plastics foil 20 of the above-described type, which slightly projects beyond the edges of the face 12 respectively 14 to prevent flashover which might otherwise occur if a high operating voltage is applied. One side of the plastics foil 20 facing away from the semiconductor body 10 carries a thin vapour-deposited aluminum film 22. Moreover, another thin film 24 of a soft metal such as indium is interposed between the plastics foil 20 and the metal electrode 16 in order to smooth over irregularities and to ensure that the plastics foil 20 will make tight contact with the semiconductor face when pressed on the semiconductor body 10 by the metal electrode 16.

The electrodes 16 are connected in the manner shown in FIG. 1 to an external circuit which comprises a single-pole two-position switch 26, a voltage source 28 schematically represented in the drawing by the symbol for a battery, a series resistor 30, and an output terminal 32 which in conventional manner may be connected to a pulse spectrometer or a pulse amplitude discriminator or some other appropriate apparatus.

Moreover, near the semiconductor body 10 there is also provided a light source, such as an incandescent lamp 34, a source of current 36 and an on-off switch 38. The changeover switch 26 and the on-off switch 38 may be manually operated or, as schematically indicated in FIG. 1, they may be controlled by a programmed control unit 40 (possibly containing a motor-driven cam operated sequence switch).

The gamma radiation detector according to FIG. 1 can be operated in two different ways: In the first method of operation the switches 26 and 38 will be in the positions shown in FIG. 1 when a measurement is to be performed, i.e. the voltage source 28 will be connected in series with resistor 30 to the electrodes 16, whereas the light source is off.

Figure 2:
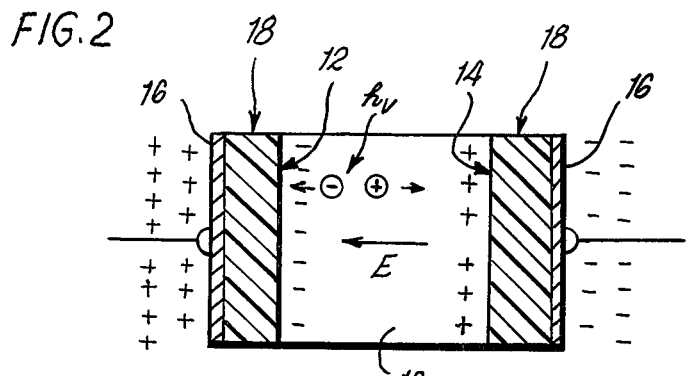
FIG. 2 is a schematic representation of a semiconductor mono-crystal and of the arrangement of the associated electrodes.

For an explanation of this method of operation let it be assumed that the voltage provided at the metal electrodes 16 by the voltage source 28 progressively rises from zero to the maximum the voltage source 28 can supply. When the voltage between the metal electrodes 16 rises above zero the thermal charge carriers which are present in the semiconductor body will first be driven to the faces 12 and 14. In FIG. 2 it has been assumed that the semiconductor body 10 is not doped, i.e. that its conductivity is intrinsic. At a particular voltage which should be a fraction of the maximum voltage the voltage source 28 can supply, all the charge carriers will have drifted out of the semiconductor body 10 to the semiconductor faces 12 and 14 where these charges will be exactly compensated by corresponding charges on the metal electrodes 16, as indicated in FIG. 2 by the rows of plus and minus signs directly alongside the metal electrodes 16 and the faces 12 and 14.

If now the voltage across the metal electrodes continues to rise further charge carriers for compensating the charge carriers which then appear on the metal electrodes 16, and which are represented by an outer bank of plus and minus signs, will then no longer be available in the semiconductor body 10. Consequently an electrical field E will build up in the semiconductor body between one metal electrode 16 and the other. The current pulse which is generated in the external circuit as a result of these events may be neglected.

The gamma detector is now ready for use. As soon as a gamma quantum hv ia absorbed by the semiconductor body a number of pairs of free charge carriers corresponding to the energy of the gamma quantum will be released, and these will be driven by the existing electrical field E to the two faces 12 and 14. A current pulse will be generated which is capacitively coupled out through the insulating layer 18 to the electrodes 16 and which will therefore appear as an output pulse at the output terminal 32, the integral of the amplitude of this pulse with respect to time representing the energy of the absorbed gamma quantum. The useful operating period of the measuring arrangement in this method of operation is governed by the ratio of the charge on the condenser plates constituted by the metal electrodes 16, the insulating layers 18 and the faces 12 and 14 when the field strength on the semiconductor body has dropped by the maximum permissible margin (say 10%) below the field strength existing when the arrangement started to operate, to the current which in the course of this time has been flowing first by the thermal charge carriers and then by the charge carriers released by the detected gamma radiation.

The operating voltage is limited solely by the electrical insulating properties of the insulating layer 18 and may for instance be in the order of 1 kV. A drop in field strength of 10% during operation is generally acceptable because at a starting voltage of this order the liberated charge carriers will still be reliably "drawn off". If the starting voltage is 1 kV and the faces 12 and 14 represent areas of 1 sq.cm each, then roughly $3 \times 10^6$ gamma quanta having a total energy of 1 MeV can be detected before the residual voltage between the two surface areas will have dropped to 900 V. The production of thermal charge carriers may, if necessary, be reduced to negligible proportions by cooling the semiconductor body 10.

In a practical embodiment of the described arrangement the semiconductor body 10 consisted of a 3 mm thick circular discs of intrinsically semiconducting silicon (resistivity 250 K Ωcm) and a diameter of 20 cm.

The faces had been etched with a mixture of three parts of hydrofluoric acid and one part of nitric acid. The electrodes were constructed as described with reference to FIG. 1, the plastics foil 20 being a polyester foil of the above-specified type which was $2.5 \times 10^{-4}$ cm thick and coated with an aluminum film on one side. Provided the radiation was not excessively intense operating times in the order of 10 hours at the temperature of liquid nitrogen were attainable without difficulty. The resolving power was excellent. For instance, the resolution of the 122 keV line was in every case better than 1.5 keV and limited only by an input amplifier associated with the external circuit.

The operating times which could be achieved with germanium were slightly shorter. Excellent results were also obtained when using highly purified cadmium sulphide monocrystals in the case of which the useful operating time was at least in the same order as that achieved with the cooled silicon crystals.

If by concentration of charge carriers at the faces 12 and 14 the prescribed lower limit of the field strength E has been reached the change-over switch 26 is operated and the electrodes 16 are thus practically short-circuited. At the same time the light source is switched on and the semiconductor body 10 is illuminated. The charges in the semiconductor body will then compensate and when the light source can be extinguished, voltage being again supplied to the metal electrodes 16 to begin a fresh measuring cycle.

Figure 3:
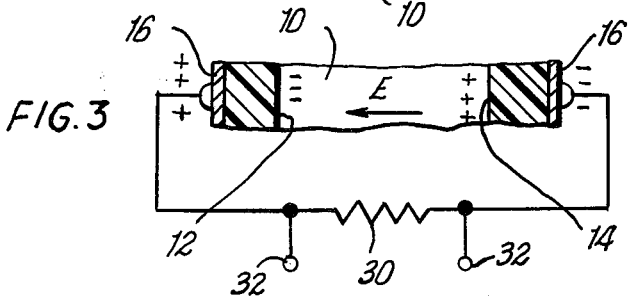
FIG. 3 is a schematic representation of part of a semiconductor mono-crystal and of the associated electrode system to which reference will be made in connection with the description of a preferred operating method of the proposed gamma ray detector.

In the alternative method of operation voltage is first applied to the metal electrodes 16 (the change-over switch 26 being in the position it occupies in FIG. 1), and the semiconductor body 10 is then briefly illuminated. When the light source has been switched off the change-over switch 26 is moved into the position in which the electrodes 16 are short-circuited through the series resistor 30, as shown in FIG. 3. The electrodes 16 in conjunction with their associated semiconductor faces 12 and 14 and any reverse space charge layers which may have appeared form charged condensers which function as a source of operating voltage. The charge carriers which have been generated by the gamma quanta compensate part of the charges present at the faces 12 and 14 and corresponding charges will then flow away from the metal electrodes 16 and give rise to a current pulse in the output circuit.

The described second method of operation has the major advantage of not requiring the gamma detector during operation to be connected to a voltage source for experiments which do not last longer than the above-described operating time. It is therefore possible to use very small measuring devices since in substance only the "charged" semiconductor body and the electrode assemblies are needed and the metal electrodes 16 can be directly connected to means adapted to make use of the output pulses.

In the second method of operation regeneration is effected by connecting the voltage source to the metal electrodes 16, then briefly illuminating the semiconductor body before again disconnecting the voltage source from the external circuit.

In both methods of operation the switching operations may be periodically effected by the programmed control unit 40. Regeneration requires only very short times in the order of say 1 ms and this is negligible compared with the long available measuring times.

It will be readily understood that in every embodiment provision is made to screen the semiconductor body 10 from interference by unwanted light by enclosing it in a housing which is transparent only to gamma rays.

It may sometimes be sufficient to isolate only one of the two metal electrodes 16 from the semiconductor body 10 by the interposition of an insulating layer.

Moreover, the above mentioned semiconductor materials could obviously be replaced by others, provided they satisfy the specified conditions.

The invention may be embodied in other specific forms without departing from the spirit or essential characteristics thereof. The embodiments are therefore to be considered in all respects as illustrative and not restrictive.

What we claim is:
1. A gamma radiation detector comprising a semiconductor body and two metal electrodes attached to two spaced surface zones of said semiconductor body, characterized by the combination of the following features:
   a. The said semiconductor body consists of a uniform semiconductor material of the same conductivity type;
   b. Charge carriers of both types are mobile in said semiconductor material and the product of their mobility multiplied by their free drift time (life) exceeds $10^{-9}$ $m^2$ $V^{-1}$ for each type of carrier;
   c. An insulating layer which is thin in relation to the distance separating said two surface zones is interposed between at least one of said electrodes and the surface zone to which it is attached.

2. A gamma radiation detector as defined in claim 1, wherin said surface zones are parallel faces on opposite sides of said semiconductor body in the form of a monocrystal, said semiconductor faces being substantially free from defects.

3. A gamma radiation detector as defined in claim 1, wherein the distance separating said two spaced surface zones is at least 0.5 mm.

4. A gamma radiation detector as defined in claim 1, wherein said semiconductor body is a highly purified semiconductor compound of the type $A_{II}B_{VI}$.

5. A gamma radiation detector as defined in claim 1, wherein said metal electrodes are associated with a circuit containing a voltage source, a working impedance, an output terminal and a change-over switch means permitting the voltage source to be disconnected and the electrodes to be short-circuited, means being also provided for briefly illuminating said semiconductor body.

6. A gamma radiation detector as defined in claim 1, characterized by the presence at said semiconductor surface zones of electrical charges of opposite sign and of a magnitude sufficient to maintain an electrical field in said semiconductor body between said two zones for the complete removal of carriers released by the absorption of gamma ray quanta, whereas said metal electrodes are directly connected without the intervention of an external voltage source to means for utilizing current pulses.

7. A gamma radiation detector as defined in claim 1, wherein said thin insulating layer is a thin foil of synthetic plastics material.

8. A gamma radiation detector as defined in claim 7, wherein the thin foil of synthetic plastics material is arranged to project beyond the edges of said surface zones.

9. A gamma radiation detector as defined in claim 5, wherein said thin insulating layer is a polyester foil.

* * * * *